(12) United States Patent
Hsu

(10) Patent No.: US 11,450,727 B2
(45) Date of Patent: Sep. 20, 2022

(54) ARRAY SUBSTRATE FOR FLEXIBLE DISPLAY PANEL INCLUDING GAP BETWEEN PERIPHERAL TRACE AND INSULATING LAYER

(71) Applicant: Au Optronics Corporation, Hsinchu (TW)

(72) Inventor: Ming-Chang Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 216 days.

(21) Appl. No.: 16/897,277

(22) Filed: Jun. 10, 2020

(65) Prior Publication Data
US 2021/0273033 A1 Sep. 2, 2021

(30) Foreign Application Priority Data
Mar. 2, 2020 (TW) .................... 109106659

(51) Int. Cl.
*H01L 27/32* (2006.01)
*H01L 51/52* (2006.01)

(52) U.S. Cl.
CPC ...... *H01L 27/3276* (2013.01); *H01L 27/3262* (2013.01); *H01L 51/5253* (2013.01); *H01L 51/5284* (2013.01)

(58) Field of Classification Search
CPC ............. H01L 27/3276; H01L 27/3262; H01L 51/5253; H01L 51/5284
USPC ......................................................... 257/40
See application file for complete search history.

(56) References Cited

U.S. PATENT DOCUMENTS

| 7,969,086 | B2 | 6/2011 | Kim |
| 9,472,507 | B2 | 10/2016 | Kwak |
| 10,553,619 | B2 | 2/2020 | Kwak |
| 2008/0030128 | A1* | 2/2008 | Kim ...................... H05B 33/04 313/504 |
| 2013/0248826 | A1 | 9/2013 | Kim et al. |
| 2014/0367658 | A1 | 12/2014 | Kwak |
| 2016/0141548 | A1* | 5/2016 | Tanaka ................ H01L 27/3276 257/40 |
| 2017/0012063 | A1 | 1/2017 | Kwak |
| 2018/0090520 | A1 | 3/2018 | Kwak |
| 2020/0161344 | A1 | 5/2020 | Kwak |

FOREIGN PATENT DOCUMENTS

CN 109378319 2/2019

* cited by examiner

Primary Examiner — Matthew E. Gordon
(74) Attorney, Agent, or Firm — JCIPRNET

(57) ABSTRACT

An array substrate includes a base, conductive structures, a peripheral trace, a first insulating layer and a second insulating layer. The base has a working area and a peripheral area outside the working area. The conductive structures are arranged in a matrix on the working area of the base. The peripheral trace is disposed on the peripheral area of the base and electrically connected to at least one of the conductive structures. The first insulating layer has an opening, wherein the peripheral trace is disposed in the opening or on the first insulating layer and besides the opening, and there is a gap between a sidewall of the first insulating layer defining the opening and the peripheral trace. The second insulating layer is disposed on the first insulating layer and the peripheral trace, and the second insulating layer is filled in the gap.

15 Claims, 13 Drawing Sheets

ARRAY SUBSTRATE FOR FLEXIBLE DISPLAY PANEL INCLUDING GAP BETWEEN PERIPHERAL TRACE AND INSULATING LAYER

CROSS-REFERENCE TO RELATED APPLICATION

This application claims the priority benefit of Taiwan application serial no. 109106659, filed on Mar. 2, 2020. The entirety of the above-mentioned patent application is hereby incorporated by reference herein and made a part of this specification.

BACKGROUND

Field of the Disclosure

The disclosure relates to an array substrate.

Description of Related Art

Recently, with the development of foldable electronic devices (e.g., foldable mobile phones), the development of flexible display panels and/or flexible touch panels has once again received increased attention.

In the manufacturing process of the flexible display panel and/or the flexible touch panel, it is necessary to cut the flexible display panel and/or the flexible touch panel from the mother board. In general, laser cutting can be adopted for the above cutting process. However, when cutting the flexible display panel and/or the flexible touch panel by using laser, the laser melts the peripheral trace of the flexible display panel and/or the peripheral trace of the flexible touch panel altogether, which causes a short circuit and consequently affects the manufacturing yield rate of the flexible display panel and/or the flexible touch panel.

SUMMARY OF THE DISCLOSURE

The disclosure provides an array substrate, which helps to improve manufacturing yield rate.

An array substrate of the disclosure includes a base, a plurality of conductive structures, a peripheral trace, a first insulating layer and a second insulating layer. The base has a working area and a peripheral area outside the working area. The plurality of conductive structures are arranged in a matrix on the working area of the base. The peripheral trace is disposed on the peripheral area of the base and electrically connected to at least one of the plurality of conductive structures. The first insulating layer has an opening, wherein the peripheral trace is disposed in the opening or on the first insulating layer and besides the opening, and there is a gap between a sidewall of the first insulating layer defining the opening and the peripheral trace. The second insulating layer is disposed on the first insulating layer and the peripheral trace, and the second insulating layer is filled in the gap.

In an embodiment of the disclosure, the peripheral trace has an edge located in the opening of the first insulating layer, and the edge of the peripheral trace is substantially aligned with the edge of the base.

In an embodiment of the disclosure, the melting point of the first insulating layer is higher than the melting point of the peripheral trace.

In an embodiment of the disclosure, the melting point of the first insulating layer is higher than the melting point of the second insulating layer.

In an embodiment of the disclosure, the height of the sidewall of the first insulating layer is greater than the thickness of the peripheral trace.

In an embodiment of the disclosure, the array substrate further includes a third insulating layer and a fourth insulating layer. The third insulating layer is disposed on the base and has an opening, wherein the first insulating layer is disposed on the third insulating layer, and the opening of the first insulating layer overlaps the opening of the third insulating layer. The fourth insulating layer is disposed in the opening of the third insulating layer, wherein the peripheral trace is disposed on the fourth insulating layer.

In an embodiment of the disclosure, the melting point of the fourth insulating layer is lower than the melting point of the third insulating layer.

In an embodiment of the disclosure, the melting point of the fourth insulating layer is lower than the melting point of the first insulating layer.

In an embodiment of the disclosure, the array substrate further includes a third insulating layer. The third insulating layer is disposed on the base and has a hole. The first insulating layer is disposed on the third insulating layer. The opening of the first insulating layer overlaps the hole of the third insulating layer. A portion of the peripheral trace is disposed on the third insulating layer, and another portion of the peripheral trace is filled in the hole of the third insulating layer.

In an embodiment of the disclosure, the plurality of conductive structures include a plurality of pixel structures, each of the pixel structures has a transistor and an electrode electrically connected to the transistor. The first insulating layer is disposed on the transistor, the transistor has a control terminal, a first terminal, and a second terminal, and the peripheral trace and the control terminal belong to the same layer.

In an embodiment of the disclosure, the plurality of conductive structures include a plurality of pixel structures, each of the pixel structures has a transistor and an electrode electrically connected to the transistor. The first insulating layer is disposed on the transistor, the transistor has a control terminal, a first terminal, and a second terminal, and the peripheral trace and the first terminal belong to the same layer.

In an embodiment of the disclosure, the plurality of conductive structures include a plurality of touch sensing electrodes.

In an embodiment of the disclosure, the array substrate further includes a film. The film is disposed on the second insulating layer, wherein the film has a recess, and the recess of the film overlaps the opening of the first insulating layer.

In an embodiment of the disclosure, the array substrate further includes a film, which is disposed on the second insulating layer. The film has a first portion and a second portion, the first portion of the film overlaps the opening of the first insulating layer, the second portion of the film overlaps the solid portion of the first insulating layer, and the thickness of the first portion of the film is smaller than the thickness of the second portion of the film.

In an embodiment of the disclosure, the array substrate further includes a film and a light-shielding pattern layer. The light-shielding pattern layer is disposed on the film and located between the film and the second insulating layer, wherein the light-shielding pattern layer has a recess, and the recess of the light-shielding pattern layer overlaps the opening of the first insulating layer.

In an embodiment of the disclosure, the array substrate further includes a film and a light-shielding pattern layer. The light-shielding pattern layer is disposed on the film and located between the film and the second insulating layer, wherein the light-shielding pattern layer has a first portion and a second portion, the first portion of the light-shielding pattern layer overlaps the opening of the first insulating layer, the second portion of the light-shielding pattern layer overlaps the solid portion of the first insulating layer, and the thickness of the first portion of the light-shielding pattern layer is smaller than the thickness of the second portion of the light-shielding pattern layer.

In an embodiment of the disclosure, the film has a first portion and a second portion, the first portion of the film overlaps the first portion of the light-shielding pattern layer, the second portion of the film overlaps the second portion of the light-shielding pattern layer, and the thickness of the first portion of the film is larger than the thickness of the second portion of the film.

DESCRIPTION OF EMBODIMENTS

Figure 1:
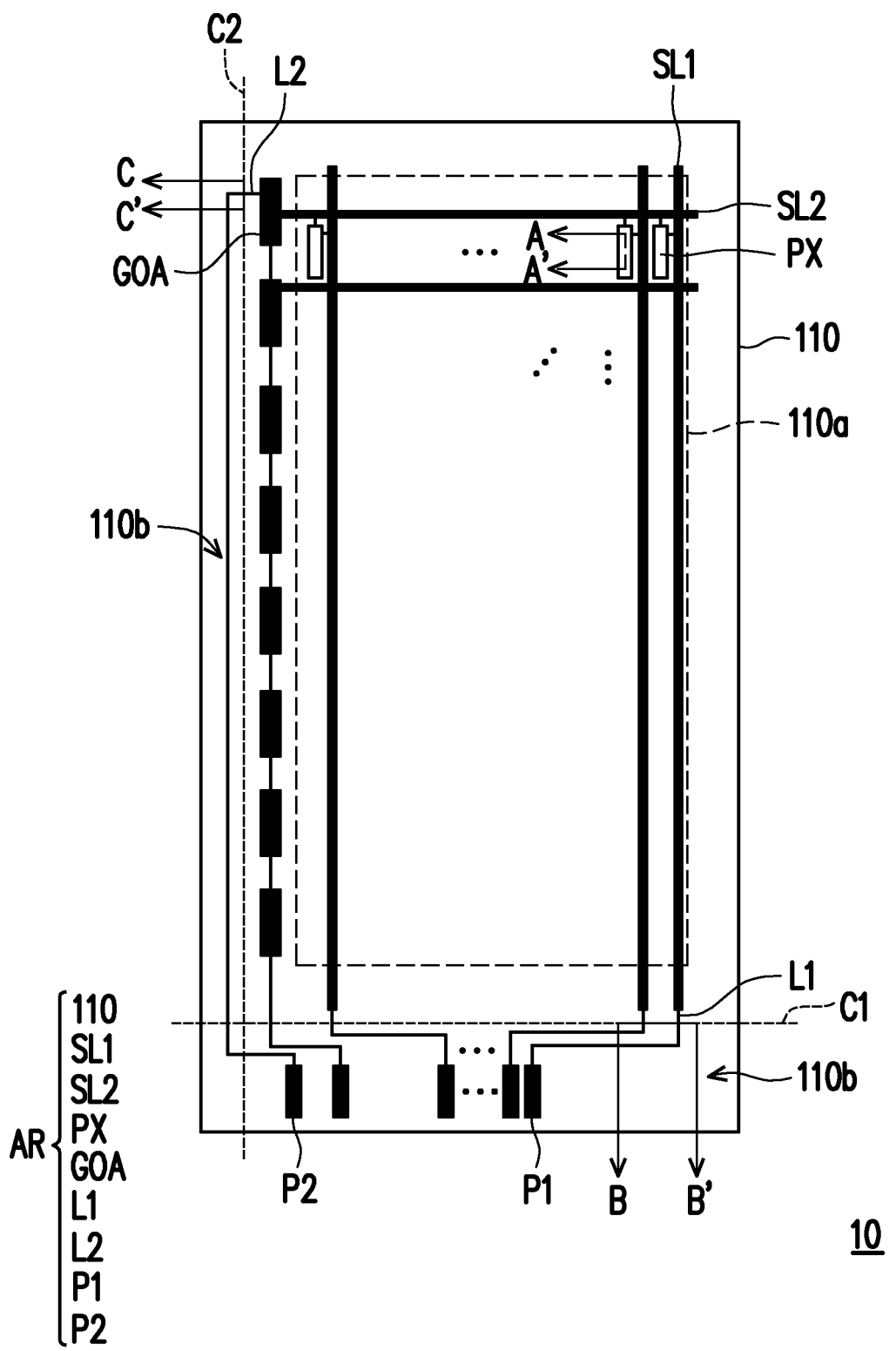
FIG. 1 is a schematic top view of an electronic device 10 according to an embodiment of the disclosure.

Hereinafter, exemplary embodiments of the disclosure are described in detail, and examples of the exemplary embodiments are conveyed via the figures. Wherever possible, the same reference numerals are used in the figures and the descriptions to refer to the same or similar portions.

It should be understood that, when a layer, film, region, or an element of a substrate is "on" another element or "connected to" another element, the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

"About", "similar", or "substantially" used in the present specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the disclosure. It should be further understood that, terminology defined in commonly-used dictionaries should be interpreted to have the same definitions in related art and in the entire specification of the disclosure, and are not interpreted as ideal or overly-formal definitions unless clearly stated as such in the present specification.

FIG. 1 is a schematic top view of an electronic device 10 according to an embodiment of the disclosure.

Figure 2:
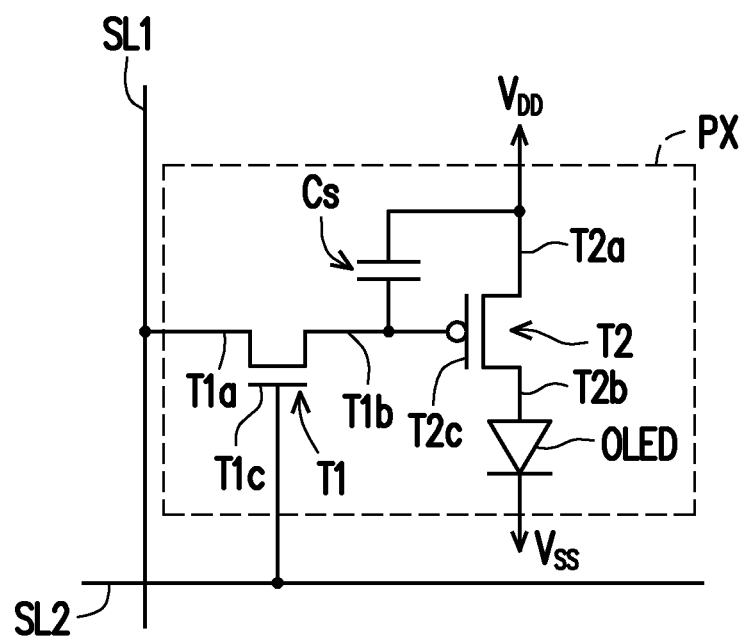
FIG. 2 is a schematic view of an equivalent circuit of a pixel structure PX of a first array substrate AR according to an embodiment of the disclosure.

FIG. 2 is a schematic view of an equivalent circuit of a pixel structure PX of a first array substrate AR according to an embodiment of the disclosure.

Figure 3:
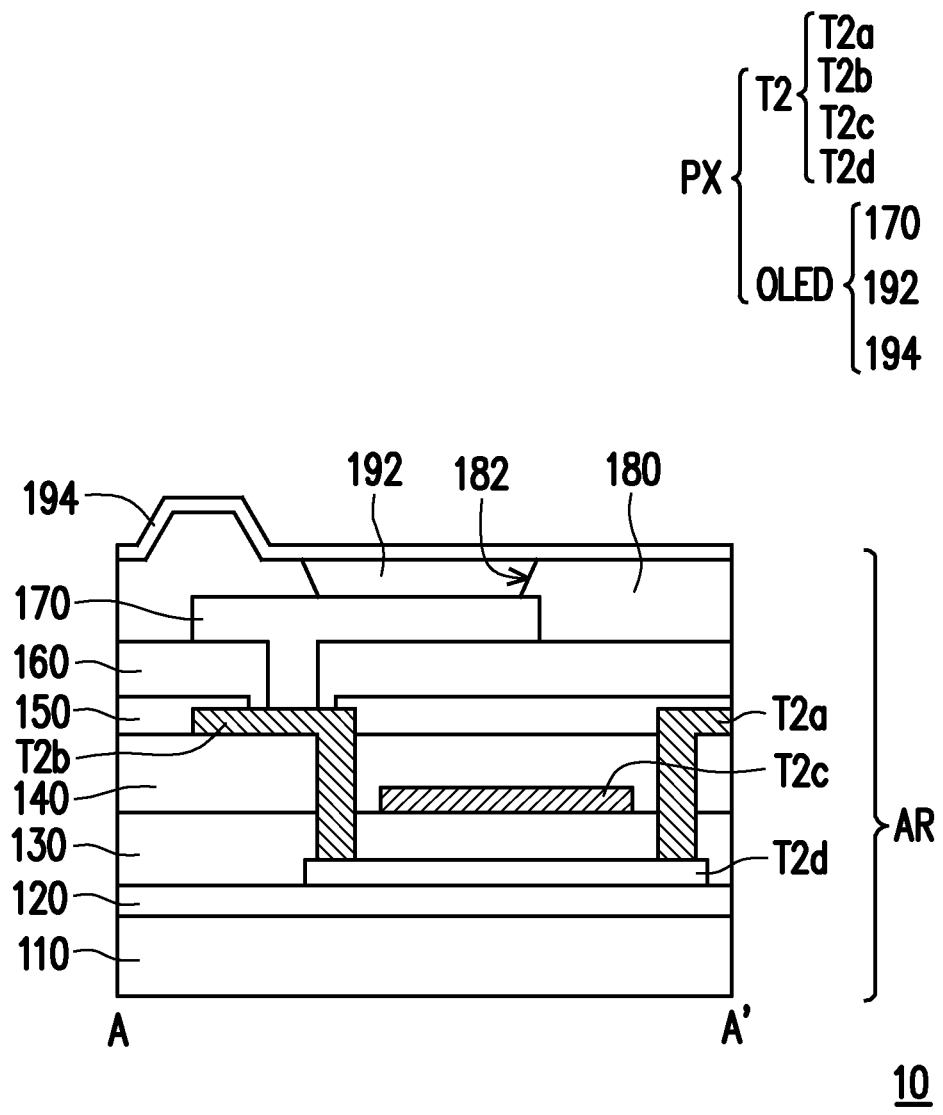
FIG. 3 is a schematic cross-sectional view of an electronic device 10 according to an embodiment of the disclosure.

FIG. 3 is a schematic cross-sectional view of an electronic device 10 according to an embodiment of the disclosure. FIG. 3 corresponds to the sectional line A-A' in FIG. 1.

Figure 4:
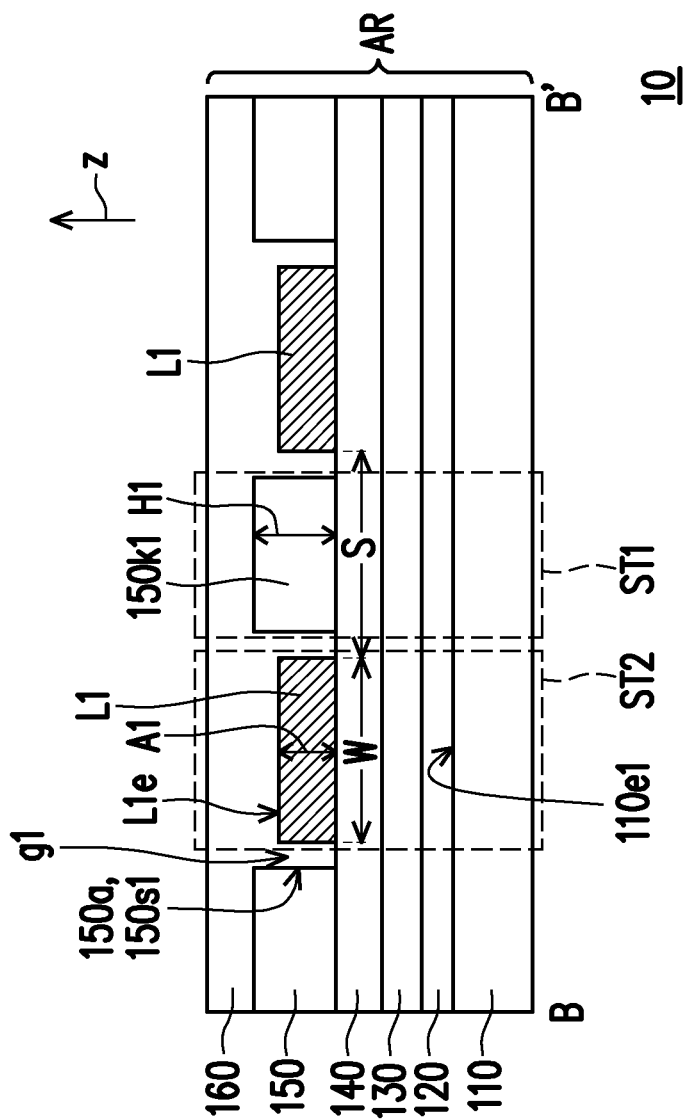
FIG. 4 is a schematic cross-sectional view of an electronic device 10 according to an embodiment of the disclosure.

FIG. 4 is a schematic cross-sectional view of an electronic device 10 according to an embodiment of the disclosure. FIG. 4 corresponds to the sectional line B-B' in FIG. 1.

Figure 5:
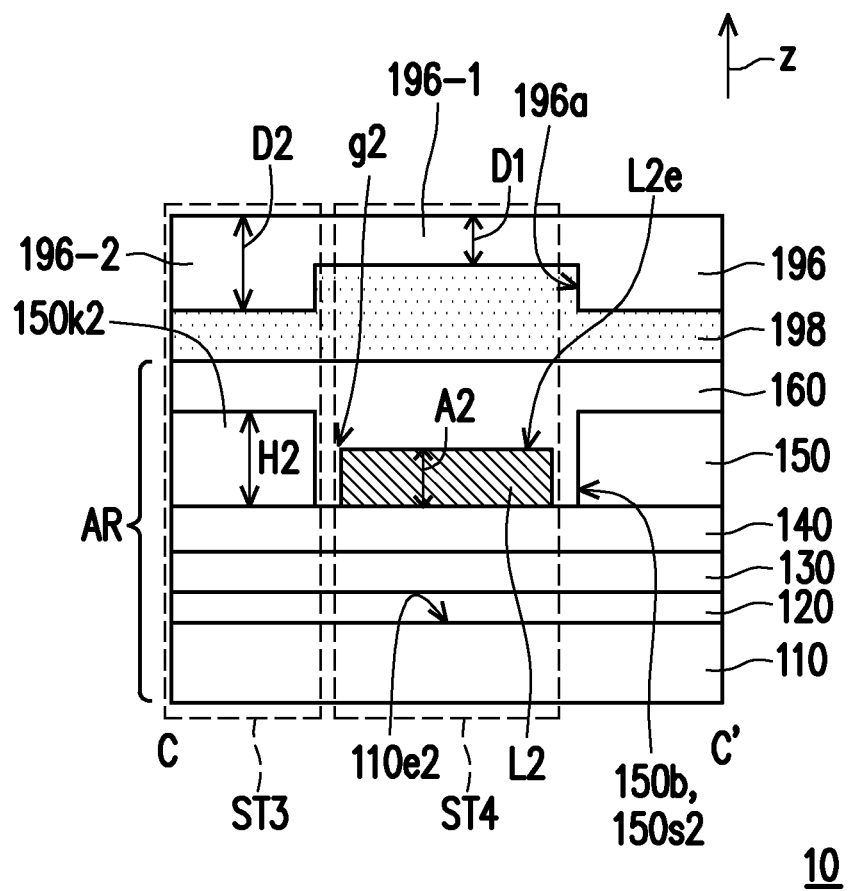
FIG. 5 is a schematic cross-sectional view of an electronic device 10 according to an embodiment of the disclosure.

FIG. 5 is a schematic cross-sectional view of an electronic device 10 according to an embodiment of the disclosure. FIG. 5 corresponds to the sectional line C-C' in FIG. 1.

FIG. 1 does not show the insulating layer 120, the insulating layer 130, the insulating layer 140, the insulating layer 150, the insulating layer 160, the insulating layer 180, the film 196, the optically clear adhesive 198 and other components in FIG. 3, FIG. 4 and FIG. 5.

Referring to FIG. 1 and FIG. 5, the electronic device 10 includes a first array substrate AR. Referring to FIG. 1, the first array substrate AR includes a base 110. The base 110 has a working area 110a and a peripheral area 110b outside the working area 110a. In this embodiment, the base 110 of the first array substrate AR is a flexible base, but the disclosure is not limited thereto. For example, the material of the flexible base can be selected from organic polymers, such as: polyimide (PI), polyethylene naphthalate (PEN), polyethylene terephthalate (PET), polycarbonates (PC), polyether sulfone (PES) or polyarylate, other suitable materials, or a combination of at least two of the foregoing.

Please refer to FIG. 1, FIG. 2 and FIG. 3, the first array substrate AR includes a plurality of conductive structures arranged in a matrix on the working area 110a of the base 110. In this embodiment, the plurality of conductive structures of the first array substrate AR include a pixel structure PX. That is to say, in this embodiment, the first array substrate AR may be a pixel array substrate, and the electronic device 10 may be a display device.

Please refer to FIG. 1, FIG. 2 and FIG. 3, for example, in this embodiment, each of the pixel structures PX includes a first transistor T1, a second transistor T2, a capacitor Cs and an organic light-emitting diode element OLED, wherein the first terminal T1a of the first transistor T1 is electrically connected to the first signal line SL1 (e.g., a data line), and the control terminal T1c of the first transistor T1 is electrically connected to the second signal line SL2 (e.g., a scanning line). The second terminal T1b of the first transistor T1 is electrically connected to the control terminal T2c of the second transistor T2, and the first terminal T2a of the second transistor T2 is electrically connected to a power line (not shown) supplying a voltage VDD. The capacitor Cs is electrically connected to the second terminal T1b of the first transistor T1 and the first terminal T2a of the second transistor T2, and the organic light-emitting diode element OLED has the first electrode 170, the organic light-emitting layer 192 disposed on the first electrode 170, and the second electrode 194 disposed on the organic light-emitting layer 192. The second terminal T2b of the second transistor T2 is electrically connected to the first electrode 170 of the organic light-emitting diode element OLED, and the second electrode 194 of the organic light-emitting diode element OLED is electrically connected to the common line (not shown) supplying the voltage Vss. However, the disclosure is not limited thereto. In other embodiments, the pixel structure PX may also be of other types.

Referring to FIG. 3, in this embodiment, the first array substrate AR further includes an insulating layer 120 disposed on the base 110; the insulating layer 120 is also referred to as a buffer layer (BL). In this embodiment, the insulating layer 120 is, for example, an inorganic insulating layer.

In this embodiment, the first array substrate AR further includes an insulating layer 130 disposed between the control terminal T2c of the second transistor T2 and the semiconductor pattern T2d; the insulating layer 130 is also referred to as a gate insulating layer (GI). In this embodiment, the insulating layer 130 is, for example, an inorganic insulating layer.

In this embodiment, the first array substrate AR further includes an insulating layer 140 disposed on the insulating layer 130 and the control terminal T2c of the second transistor T2; the insulating layer 140 is also referred to as an interlayer dielectric (ILD) layer. In this embodiment, the insulating layer 140 is, for example, an inorganic insulating layer.

In this embodiment, the first array substrate AR further includes an insulating layer 150 disposed on the insulating layer 140, the first terminal T2a and the second terminal T2b of the second transistor T2; the insulating layer 150 is also referred to as a barrier protection layer. In this embodiment, the insulating layer 150 is, for example, an inorganic insulating layer.

In this embodiment, the first array substrate AR further includes an insulating layer 160 disposed on the insulating layer 150; the first electrode 170 of the organic light-emitting diode element OLED is disposed on the insulating layer 160, and the insulating layer 160 is also referred to as a planarization layer (PL). In this embodiment, the insulating layer 160 is, for example, an organic insulating layer.

In this embodiment, the first array substrate AR further includes an insulating layer 180 disposed on the insulating layer 160 and the first electrode 170 of the organic light-emitting diode element OLED; the insulating layer 180 has a pixel opening 182 for the organic light-emitting layer 192 to fill in, and the insulating layer 180 is also referred to as a pixel definition layer (PDL). In this embodiment, the insulating layer 180 is, for example, an organic insulating layer.

The melting point of the inorganic insulating layer is higher than that of the organic insulating layer. For example, in this embodiment, the melting point of the inorganic insulating layer is about 1710° C. to 1900° C., and the melting point of the organic insulating layer is about 250° C., but the disclosure is not limited thereto. In this embodiment, the material of the inorganic insulating layer is, for example, silicon oxide, silicon nitride, silicon oxynitride, other suitable materials, or a stacked layer of at least two of the above materials, but the disclosure is not limited thereto. In this embodiment, the material of the organic insulating layer is, for example, a polymer material such as polyimide-based resin, epoxy-based resin, or acrylic-based resin, but the disclosure is not limited thereto.

Please refer to FIG. 1 and FIG. 2, the first array substrate AR further includes a plurality of first peripheral traces L1. The plurality of first peripheral traces L1 are disposed on the peripheral area 110b of the base 110, and each of the first peripheral traces L1 is electrically connected to at least one conductive structure (such as but not limited to: a pixel structure PX).

For example, in this embodiment, the plurality of pixel structures PX are respectively electrically connected to the plurality of first signal lines SL1, and the plurality of first signal lines SL1 are respectively electrically connected to the plurality of driving chip pads (not shown) disposed in the peripheral area 110b. The plurality of driving chip pads are respectively electrically connected to the plurality of first peripheral traces L1, and the plurality of first peripheral traces L1 are respectively electrically connected to the plurality of first testing pads P1. Briefly, in this embodiment, the first peripheral trace L1 is, for example, a testing line electrically connected to the first signal line SL1. However, the disclosure is not limited thereto. In other embodiments, the first peripheral trace L1 may also be a testing line electrically connected to the power line, the common line, or other conductive lines.

In this embodiment, the first peripheral trace L1 may be formed of metal materials, alloys, nitrides of metal materials, oxides of metal materials, oxynitrides of metal materials, other conductive materials, or a stacked layer of at least two of the above materials. For example, in this embodiment, a stacked layer of titanium (Ti)/aluminum (Al)/titanium (Ti) may be adopted for the first peripheral trace L1. The melting point of the first peripheral trace L1 is about 660° C. to 1668° C. However, the disclosure is not limited thereto.

Referring to FIG. 1 and FIG. 4, it should be noted that the insulating layer 150 of the first array substrate AR has an opening 150a. The first peripheral trace L1 is disposed in the opening 150a of the insulating layer 150. There is a gap g1 between the sidewall 150s1 of the insulating layer 150 defining the opening 150a and the first peripheral trace L1.

The insulating layer 160 is disposed on the insulating layer 150 and the first peripheral trace L1 and fills the gap g1.

It should be noted that FIG. 1 shows an electronic device 10 that has not been cut yet. The electronic device 10 of FIG. 1 is adapted to be cut along a predetermined cutting path C1. In this embodiment, the electronic device 10 can be cut by using laser. The predetermined cutting path C1 is alternated with the plurality of first peripheral traces L1. When the laser is adopted to cut the electronic device 10 along the predetermined cutting path C1, a portion of each of the first peripheral traces L1 at the predetermined cutting path C1 will be melted by the laser. It should be noted that, because the portion of the first peripheral trace L1 alternating with the predetermined cutting path C1 is disposed in the opening 150a of the insulating layer 150, and there is the gap g1 formed between the sidewall 150s1 of the insulating layer 150 defining the opening 150a and the first peripheral trace L1, during the cutting process, the melted part of the first peripheral trace L1 will be restricted by the opening 150a of the insulating layer 150, and is not easily melted together with another adjacent first peripheral trace L1 to cause a short circuit.

Referring to FIG. 4, the first array substrate AR includes a stacked structure ST1 and a stacked structure ST2 adjacent to each other and located at the predetermined cutting path C1, wherein the stacked structure ST1 has a solid portion 150k1 of the insulating layer 150, and the stacked structure ST2 has a portion of the first peripheral trace L1 overlapping the opening 150a of the insulating layer 150 and a portion of the insulating layer 160 disposed in the gap g1. In this embodiment, the melting point of the insulating layer 150 is higher than the melting point of the first peripheral trace L1, the melting point of the insulating layer 150 is higher than the melting point of the insulating layer 160, and the melting point of the overall stacked structure ST2 is lower than the melting point of the overall stacked structure ST1. In addition, the stacked structure ST2 is also softer than the stacked structure ST1. Please refer to FIG. 1 and FIG. 4, in this manner, when using laser to cut the electronic device 10 along the predetermined cutting path C1 (that is, when the stacked structure ST1 and the stacked structure ST2 are melted by the laser), the stacked structure ST2 descends more easily than the stacked structure ST1. In this way, the stacked structure ST1 becomes a barrier to the stacked structure ST2 having the first peripheral trace L1, and the first peripheral trace L1 in the stacked structure ST2 is less likely to be melted together with another adjacent first peripheral trace L1 to cause a short circuit, and accordingly the manufacturing yield rate of the electronic device 10 can be further improved.

Referring to FIG. 4, in addition, in this embodiment, the height H1 of the sidewall 150s1 of the insulating layer 150 may be selectively larger than the thickness A1 of the first peripheral trace L1. In this way, when the electronic device 10 is cut by laser along the predetermined cutting path C1, the melted part of the first peripheral trace L1 is less likely to overflow the opening 150a of the insulating layer 150, and is less likely to be melted together with another adjacent first peripheral trace L1 to cause a short circuit.

The gap g1 between the sidewall 150s1 of the insulating layer 150 defining the opening 150a and the first peripheral trace L1 has a width b. In this embodiment, $0.5\ \mu m \leq b \leq 2\ \mu m$, but the disclosure is not limited thereto. The first peripheral trace L1 has a line width W. In this embodiment, $2\ \mu m \leq W \leq 20\ \mu m$, but the disclosure is not limited thereto. There is a spacing S between two adjacent first peripheral traces L1. In this embodiment, $1\ \mu m \leq S \leq 5\ \mu m$, but the disclosure is not limited thereto.

FIG. 1 shows an electronic device 10 that has not been cut yet. The electronic device 10 of FIG. 1 is adapted to be cut along the predetermined cutting path C1. FIG. 4 is a schematic cross-sectional view of the electronic device 10 corresponding to the sectional line B-B' of FIG. 1. The sectional line B-B' is at the cutting path C1, and therefore FIG. 4 may also be regarded as a schematic side view of the electronic device 10 that is cut out along the predetermined cutting path C1. Please refer to FIG. 4, before the electronic device 10 is cut out, the plurality of first peripheral traces L1 intersect with the predetermined cutting path C1. Therefore, after cutting out the electronic device 10 along the predetermined cutting path C1, the first peripheral trace L1 has an edge L1e in the opening 150a of the insulating layer 150, and the edge L1e of the first peripheral trace L1 will be substantially aligned with the edge 110e1 of the base 110. That is to say, in the direction z perpendicular to the base 110, the end terminal with the first peripheral trace L1 substantially coincides with the edge 110e1 of the base 110.

Please refer to FIG. 1 and FIG. 5 both, the first array substrate AR further includes a second peripheral trace L2. The second peripheral trace L2 is disposed on the peripheral area 110b of the base 110, and the second peripheral trace L2 is electrically connected to at least one conductive structure (such as but not limited to: a pixel structure PX).

Please refer to FIG. 1, FIG. 2 and FIG. 5, in this embodiment, the first array substrate AR may selectively include an integrated gate driver-on-array GOA electrically connected to the second signal line SL2, and the second peripheral trace L2 can be electrically connected to the integrated gate driver-on-array GOA, but the disclosure is not limited thereto. In this embodiment, the second peripheral trace L2 may be electrically connected to the second testing pad P2, and the second peripheral trace L2 may be a testing line, but the disclosure is not limited thereto.

In this embodiment, the second peripheral trace L2 may be formed of metal materials, alloys, nitrides of metal materials, oxides of metal materials, oxynitrides of metal materials, other conductive materials, or a stacked layer of at least two of the above materials. For example, in this embodiment, a stacked layer of titanium (Ti)/aluminum (Al)/titanium (Ti) may be adopted for the second peripheral trace L2. The melting point of the second peripheral trace L2 is about 660° C. to 1668° C. However, the disclosure is not limited thereto.

Please refer to FIG. 1 and FIG. 5, it should be noted that the insulating layer 150 of the first array substrate AR further has an opening 150b. The second peripheral trace L2 is disposed in the opening 150b of the insulating layer 150. There is a gap g2 formed between the sidewall 150s2 of the insulating layer 150 defining the opening 150b and the second peripheral trace L2. The insulating layer 160 is disposed on the insulating layer 150 and the second peripheral trace L2 and fills the gap g2.

It should be noted that FIG. 1 shows an electronic device 10 that has not been cut yet. The electronic device 10 of FIG. 1 is adapted to be cut along a predetermined cutting path C2. In this embodiment, the electronic device 10 can be cut by using laser. The predetermined cutting path C2 is alternated with the second peripheral trace L2. When the laser is adopted to cut the electronic device 10 along the predetermined cutting path C2, a portion of the second peripheral trace L2 at the predetermined cutting path C2 will be melted by the laser. It should be noted that, because the portion of the second peripheral trace L2 alternating with the predetermined cutting path C2 is disposed in the opening 150*b* of the insulating layer 150, and there is the gap g2 formed between the sidewall 150*s*2 of the insulating layer 150 defining the opening 150*b* and the second peripheral trace L2, during the cutting process, the melted part of the second peripheral trace L2 will be restricted by the opening 150*b* of the insulating layer 150, and is not easily melted together with other adjacent conductive component (not shown) to cause a short circuit.

Referring to FIG. 5, the first array substrate AR includes a stacked structure ST3 and a stacked structure ST4 adjacent to each other and located at the predetermined cutting path C2, wherein the stacked structure ST3 has a solid portion 150*k*2 of the insulating layer 150, and the stacked structure ST4 has the second peripheral trace L2 overlapping the opening 150*b* of the insulating layer 150 and a portion of the insulating layer 160 disposed in the gap g2. In this embodiment, the melting point of the insulating layer 150 is higher than the melting point of the second peripheral trace L2, the melting point of the insulating layer 150 is higher than the melting point of the insulating layer 160, and the melting point of the overall stacked structure ST4 is lower than the melting point of the overall stacked structure ST3. In addition, the stacked structure ST4 is also softer than the stacked structure ST3. Please refer to FIG. 1 and FIG. 5, in this manner, when using laser to cut the electronic device 10 along the predetermined cutting path C2 (that is, when the stacked structure ST3 and the stacked structure ST4 are melted by the laser), the stacked structure ST4 descends deeper than the stacked structure ST3. In this manner, the stacked structure ST3 becomes a barrier to the stacked structure ST4 having the second peripheral trace L2, and the second peripheral trace L2 in the stacked structure ST4 is less likely to be melted together with other adjacent conductive component (not shown) to cause a short circuit, and accordingly the manufacturing yield rate of the electronic device 10 can be further improved.

Referring to FIG. 5, in addition, in this embodiment, the height H2 of the sidewall 150*s*2 of the insulating layer 150 may be selectively larger than the thickness A2 of the second peripheral trace L2. In this way, when the electronic device 10 is cut by laser along the predetermined cutting path C2, the melted part of the second peripheral trace L2 is less likely to overflow the opening 150*b* of the insulating layer 150, and is less likely to be melted together with other adjacent conductive component (not shown) to cause a short circuit.

FIG. 1 shows an electronic device 10 that has not been cut yet. The electronic device 10 of FIG. 1 is adapted to be cut along the predetermined cutting path C2. FIG. 5 is a schematic cross-sectional view of the electronic device 10 corresponding to the sectional line C-C' of FIG. 1. The sectional line C-C' is at the cutting path C2, and therefore FIG. 5 may also be regarded as a schematic side view of the electronic device 10 that is cut out along the predetermined cutting path C2. Please refer to FIG. 5, before the electronic device 10 is cut out, the plurality of second peripheral traces L2 intersect with the predetermined cutting path C2. Therefore, after cutting out the electronic device 10 along the predetermined cutting path C2, the second peripheral trace L2 has an edge L2*e* in the opening 150*b* of the insulating layer 150, and the edge L2*e* of the second peripheral trace L2 will be substantially aligned with the edge 110*e*2 of the base 110. That is to say, in the direction z perpendicular to the base 110, the end terminal with the second peripheral trace L2 substantially coincides with the edge 110*e*2 of the base 110.

Referring to FIG. 1 and FIG. 5, in this embodiment, the electronic device 10 further includes a film 196 disposed on the insulating layer 160 of the first array substrate AR. The film 196 is configured to protect the first array substrate AR and is connected to the first array substrate AR by using an optically clear adhesive (OCA) 198. In this embodiment, the film 196 is formed of a flexible material, but the disclosure is not limited thereto. For example, the flexible material can be selected from organic polymers, such as polyimide (PI), polyethylene naphthalate (PEN), polyethylene terephthalate (PET), polycarbonates (PC), polyether sulfone (PES) or polyarylate, other suitable materials, or a combination of at least two of the foregoing. In this embodiment, the melting point of the optically clear adhesive 198 is low, such as but not limited to: about 178° C.

Please refer to FIG. 5. It should be that in this embodiment, the film 196 has a recess 196*a*, and the recess 196*a* of the film 196 overlaps the opening 150*b* of the insulating layer 150. In other words, the film 196 has a first portion 196-1 and a second portion 196-2, the first portion 196-1 of the film 196 overlaps the opening 150*b* of the insulating layer 150, the second portion 196-2 of the film 196 overlaps the solid portion 150*k*2 of the insulating layer 150, and the thickness D1 of the first portion 196-1 of the film 196 is smaller than the thickness D2 of the second portion 196-2 of the film 196. In this manner, the melting point difference between the stacked structure ST3 and the stacked structure ST4 will be larger. When using laser to cut the electronic device 10 along the predetermined cutting path C2 (that is, when the stacked structure ST3 and the stacked structure ST4 are melted by laser), the stacked structure ST4 will descend deeper than the stacked structure ST3. As a result, the second peripheral trace L2 in the stacked structure ST4 is less likely to be melted together with other adjacent conductive component (not shown) to cause a short circuit, and therefore the manufacturing yield rate of the electronic device 10 can be further improved.

It should be noted here that the following embodiments use the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be narrated in the following embodiment.

Figure 6:
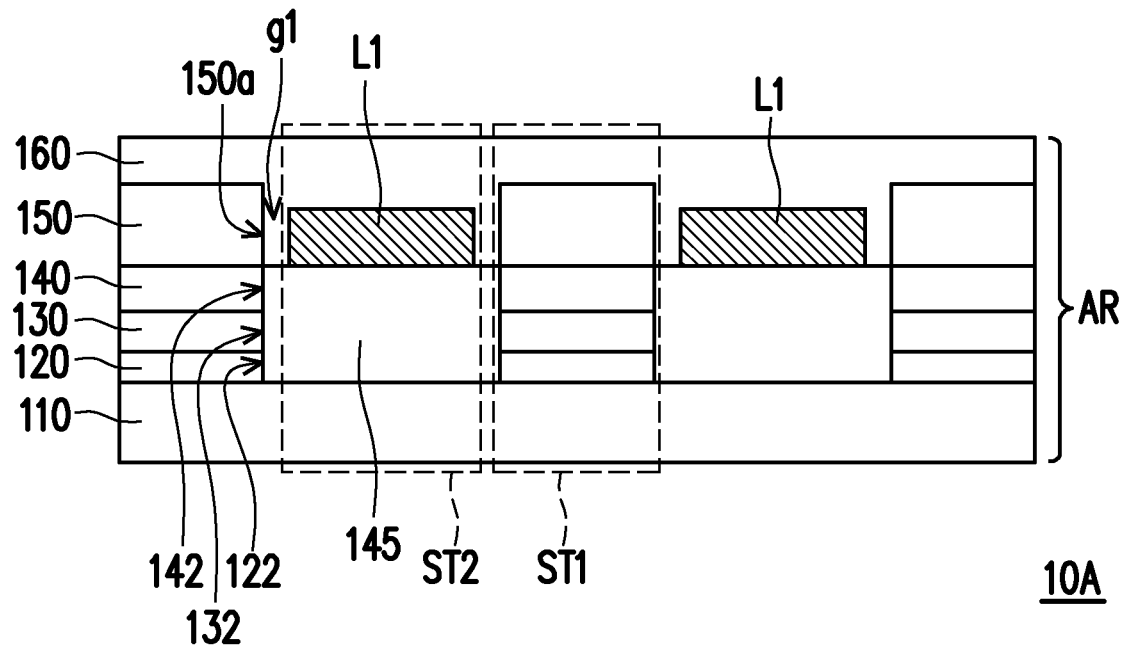
FIG. 6 is a schematic cross-sectional view of an electronic device 10A according to an embodiment of the disclosure.

FIG. 6 is a schematic cross-sectional view of an electronic device 10A according to an embodiment of the disclosure. The electronic device 10A of FIG. 6 is similar to the electronic device 10 of FIG. 4, the difference between the two is that: in the embodiment of FIG. 6, the insulating layers 120, 130 and 140 are disposed on the base 110 and have openings 122, 132 and 142, wherein the insulating layer 150 is disposed on the insulating layer 140, and the opening 150*a* of the insulating layer 150 overlaps the openings 122, 132, and 142 of the insulating layers 120, 130, and 140. Specifically, the first array substrate AR of FIG. 6 further includes an insulating layer 145, and the insulating layer 145 is disposed in the openings 122, 132, and 142 of the insulating layers 120, 130, and 140, wherein the first peripheral trace L1 is disposed on the insulating layer 145. In this embodiment, the melting point of the insulating layer 145 is lower than the melting points of the insulating layers 120, 130 and 140; the melting point of the insulating layer 145 is lower than the melting point of the insulating layer 150. For example, in this embodiment, the insulating layer 145 is, for example, an organic insulating layer.

It should be noted that, in the embodiment, since the first peripheral trace L1 is disposed on the insulating layer 145 that is softer and has a low melting point, the melting point difference and hardness difference between the stacked structure ST1 and the stacked structure ST2 will be larger. When using laser to cut the electronic device 10A along the predetermined cutting path C1 (that is, when the stacked structure ST1 and the stacked structure ST2 are melted by laser), the height difference between the stacked structure ST2 and the stacked structure ST1 is more obvious. In this way, the first peripheral trace L1 in the stacked structure ST2 is less likely to be melted together with another adjacent first peripheral trace L1 to cause a short circuit, which contributes to the improvement of the manufacturing yield rate of the electronic device 10A.

Figure 7:
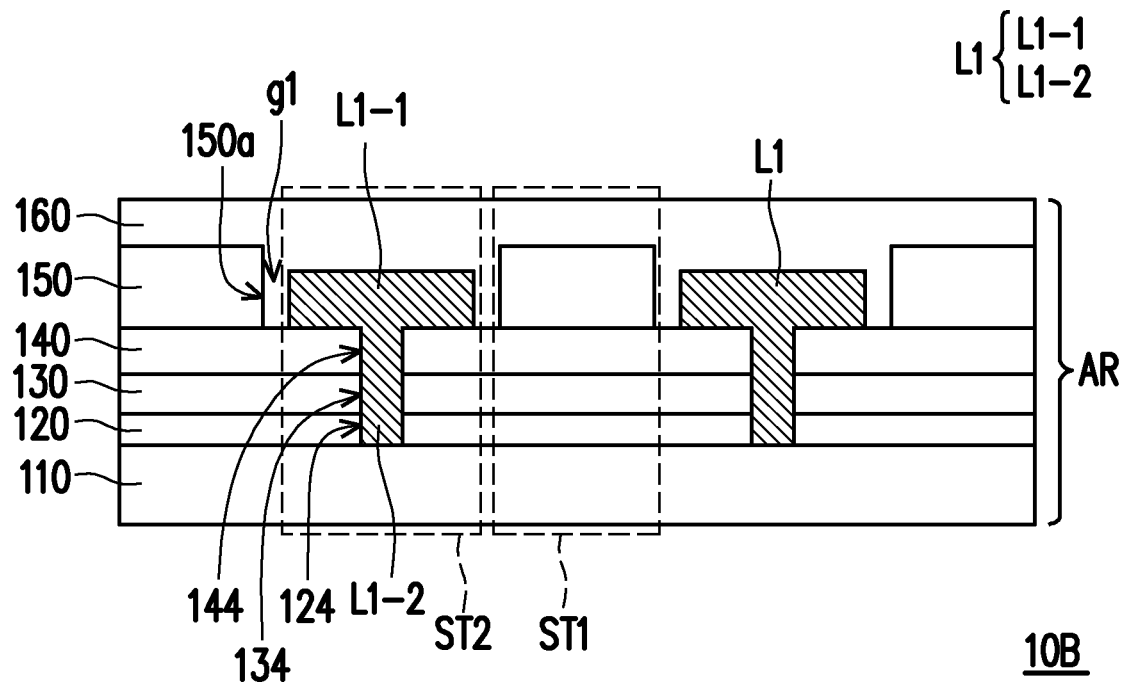
FIG. 7 is a schematic cross-sectional view of an electronic device 10B according to an embodiment of the disclosure.

FIG. 7 is a schematic cross-sectional view of an electronic device 10B according to an embodiment of the disclosure. The electronic device 10B shown in FIG. 7 is similar to the electronic device 10 shown in FIG. 4. The difference between the two is that: in the embodiment of FIG. 7, the insulating layers 120, 130 and 140 are disposed on the base 110 and have holes 124, 134 and 144 smaller than the opening 150a, wherein the insulating layer 150 is disposed on the insulating layer 140, the opening 150a of the insulating layer 150 overlaps the holes 124, 134 and 144 of the insulating layers 120, 130 and 140. A portion L1-1 of the first peripheral trace L1 is disposed on the insulating layer 140, and another portion L1-2 of the first peripheral trace L1 is filled into the holes 124, 134 and 144 of the insulating layers 120, 130 and 140.

It should be noted that, since a portion L1-1 of the first peripheral trace L1 is disposed in the opening 150a of the insulating layer 150, and another portion L1-2 of the first peripheral trace L1 is disposed in the holes 124, 134, and 144 under the opening 150a, when using laser to cut the electronic device 10B along the predetermined cutting path C1 (that is, when the first peripheral trace L1 is melted by the laser), not only a portion L1-1 of the first peripheral trace L1 will be restricted by the opening 150a of the insulating layer 150, but also another portion L1-2 of the first peripheral trace L1 will be restricted by the holes 124, 134 and 144 of the insulating layers 120, 130 and 140. In this manner, the first peripheral trace L1 is less likely to be melted together with another adjacent first peripheral trace L1 to cause a short circuit, which contributes to the improvement of the manufacturing yield rate of the electronic device 10B.

Figure 8:
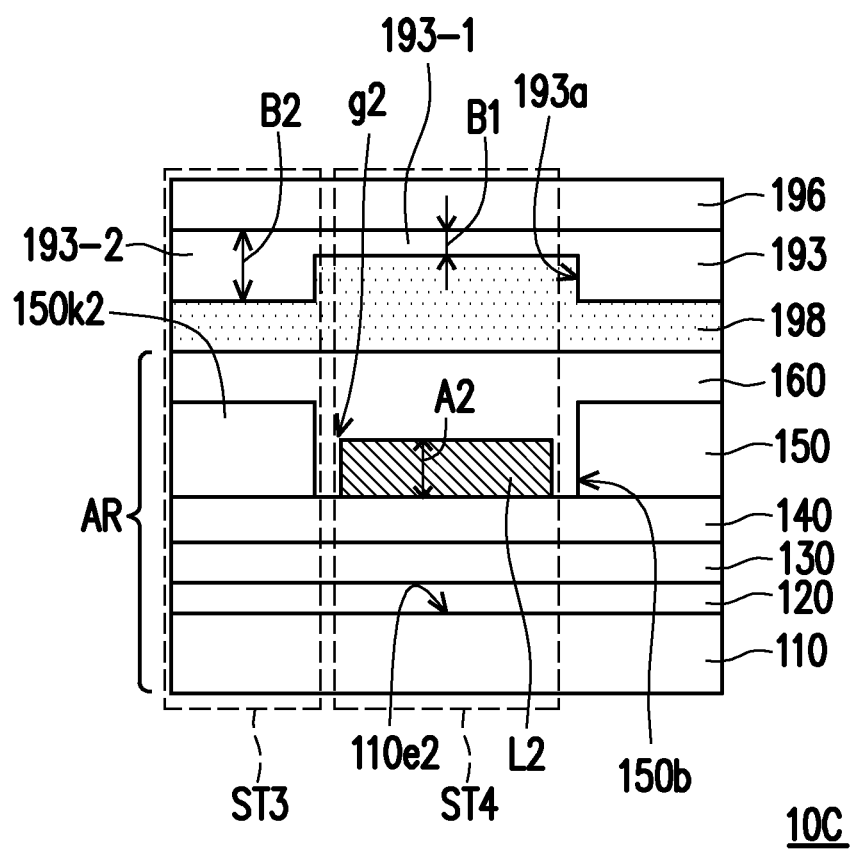
FIG. 8 is a schematic cross-sectional view of an electronic device 10C according to an embodiment of the disclosure.

FIG. 8 is a schematic cross-sectional view of an electronic device 10C according to an embodiment of the disclosure. The electronic device 10C of FIG. 8 is similar to the electronic device 10 of FIG. 5, the difference between the two is that: in the embodiment of FIG. 8, the electronic device 10C further includes a light-shielding pattern layer 193 that is disposed on the film 196 and located between the film 196 and the insulating layer 160, wherein the light-shielding pattern layer 193 has a recess 193a, and the recess 193a of the light-shielding pattern layer 193 overlaps the opening 150b of the insulating layer 150. In other words, the light-shielding pattern layer 193 has a first portion 193-1 and a second portion 193-2. The first portion 193-1 of the light-shielding pattern layer 193 overlaps the opening 150b of the insulating layer 150, the second portion 193-2 of the light-shielding pattern layer 193 overlaps the solid portion 150k2 of the insulating layer 150, and the thickness B1 of the first portion 193-1 of the light-shielding pattern layer 193 is smaller than the thickness B2 of the second portion 193-2 of the light-shielding pattern layer 193. In this manner, the stacked structure ST4 including the second peripheral trace L2 will be softer than the stacked structure ST3, and the melting point of the stacked structure ST4 will be lower than that of the stacked structure ST3. When using laser to cut the electronic device 10C along the predetermined cutting path C2 (that is, when the stacked structure ST3 and the stacked structure ST4 are melted by the laser), the height difference between the stacked structure ST4 and the stacked structure ST3 will be more obvious. Accordingly, the second peripheral trace L2 in the stacked structure ST4 is less likely to be melted together with other adjacent conductive components (not shown) to cause a short circuit, which contributes to the improvement of the manufacturing yield rate of the electronic device 10C.

In this embodiment, the light-shielding pattern layer 193 may also be referred to as a black matrix (BM). In this embodiment, the material of the light-shielding pattern layer 193 is, for example, black resin, but the disclosure is not limited thereto.

Figure 9:
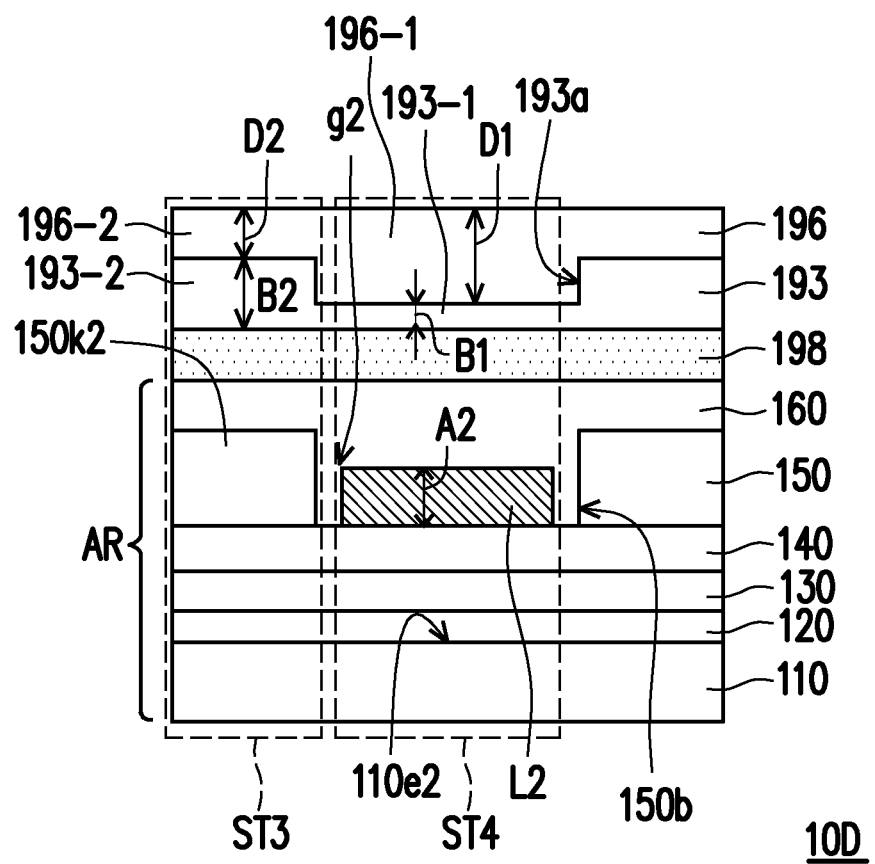
FIG. 9 is a schematic cross-sectional view of an electronic device 10D according to an embodiment of the disclosure.

FIG. 9 is a schematic cross-sectional view of an electronic device 10D according to an embodiment of the disclosure. The electronic device 10D of FIG. 9 is similar to the electronic device 10C of FIG. 8, the difference between the two is that: in the embodiment of FIG. 9, the film 196 has a first portion 196-1 and a second portion 196-2, and the first portion 196-1 of the film 196 overlaps the first portion 193-1 of the light-shielding pattern layer 193, the second portion 196-2 of the film 196 overlaps the second portion 193-2 of the light-shielding pattern layer 193, and the thickness D1 of the first portion 196-1 of the film 196 is larger than the thickness D2 of the second portion 196-2 of the film 196. In other words, the first portion 196-1 of the film 196 is a protrusion, and the protrusion is complementary to the recess 193a of the light-shielding pattern layer 193.

Figure 10:
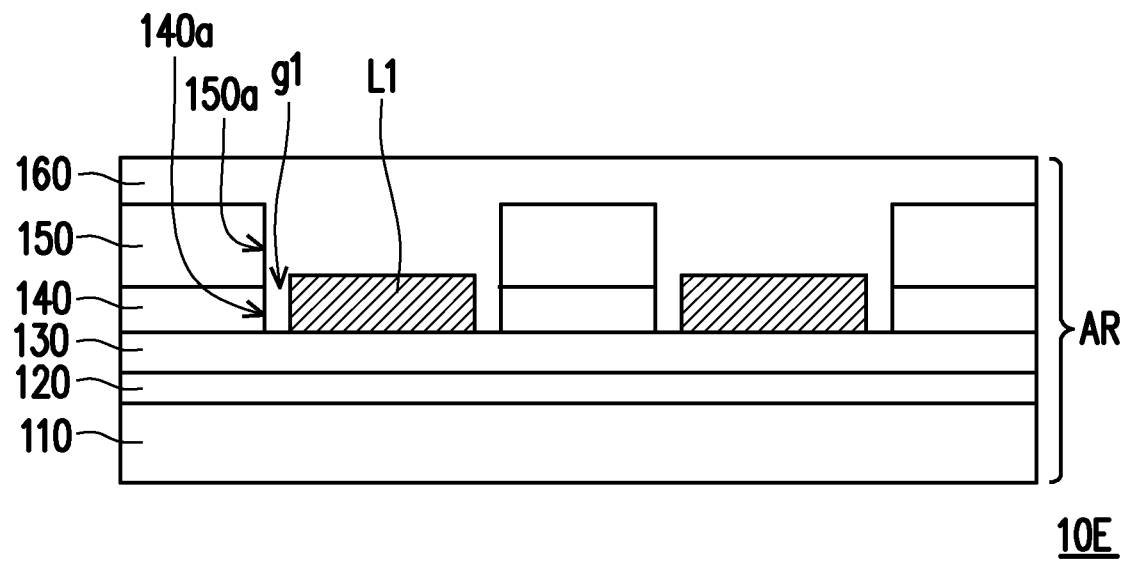
FIG. 10 is a schematic cross-sectional view of an electronic device 10E according to an embodiment of the disclosure.

FIG. 10 is a schematic cross-sectional view of an electronic device 10E according to an embodiment of the disclosure. The electronic device 10E shown in FIG. 10 is similar to the electronic device 10 shown in FIG. 4. The difference between the two is that: in the embodiment of FIG. 10, the insulating layer 140 has an opening 140a overlapping the opening 150a of the insulating layer 150. The first peripheral trace L1 is disposed in the opening 140a of the insulating layer 140. In other words, in the embodiment of FIG. 4, the first peripheral trace L1 and the first terminal T2a (shown in FIG. 3) of the second transistor T2 belong to the same layer. That is, in the embodiment of FIG. 4, the first peripheral trace L1 belongs to the second metal layer. However, in the embodiment of FIG. 10, the first peripheral trace L1 belongs to the same layer as the control terminal T2c of the second transistor T2. That is to say, in the embodiment of FIG. 10, the first peripheral trace L1 belongs to the first metal layer.

In this embodiment, the first peripheral trace L1 may be formed of metal materials, alloys, nitrides of metal materials, oxides of metal materials, oxynitrides of metal materials, other conductive materials, or a stacked layer of at least two of the above materials. For example, in this embodiment, a stacked layer of molybdenum (Mo)/aluminum (Al)/molybdenum (Mo) may be adopted for the first peripheral trace L1. The melting point of the first peripheral trace L1 is about 660° C. to 2623° C. However, the disclosure is not limited thereto.

Figure 11:
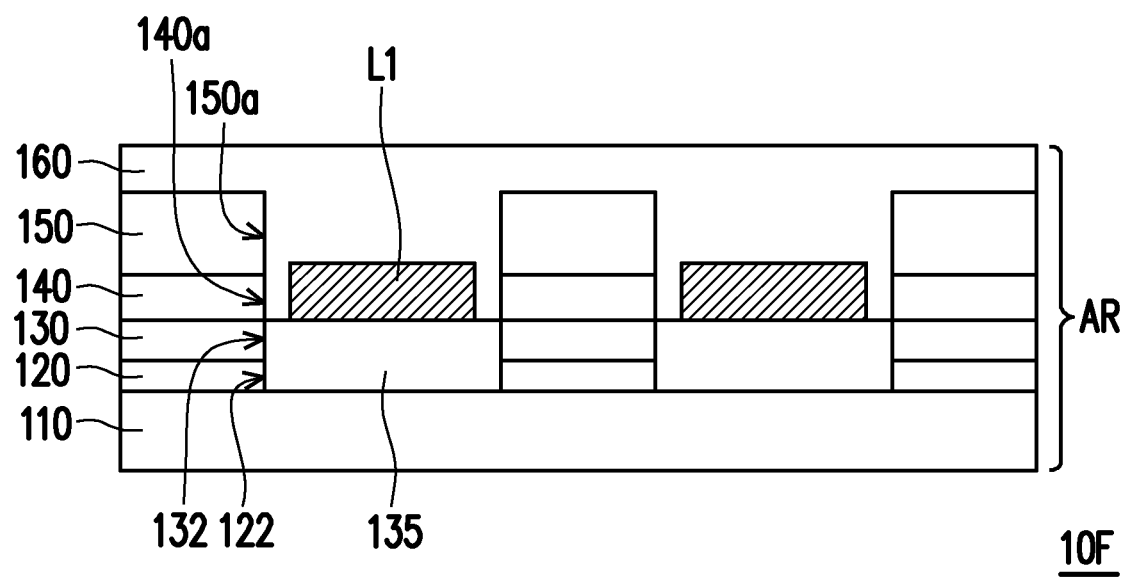
FIG. 11 is a schematic cross-sectional view of an electronic device 10F according to an embodiment of the disclosure.

FIG. 11 is a schematic cross-sectional view of an electronic device 10F according to an embodiment of the disclosure. The electronic device 10F of FIG. 11 is similar to the electronic device 10E of FIG. 10, and the difference between the two is that: in the embodiment of FIG. 11, the insulating layers 120 and 130 are disposed on the base 110 and have openings 122 and 132, wherein the insulating layer 150 is disposed on the insulating layer 140, and the opening 150a of the insulating layer 150 overlaps the openings 122 and 132 of the insulating layers 120 and 130. The first array substrate AR of FIG. 11 further includes an insulating layer 135, the insulating layer 135 is disposed in the openings 122 and 132 of the insulating layers 120 and 130, wherein the first peripheral trace L1 is disposed on the insulating layer 135. In this embodiment, the melting point of the insulating layer 135 is lower than the melting points of the insulating layers 120, 130, 140 and 150. For example, in this embodiment, the insulating layer 135 is, for instance, an organic insulating layer.

Figure 12:
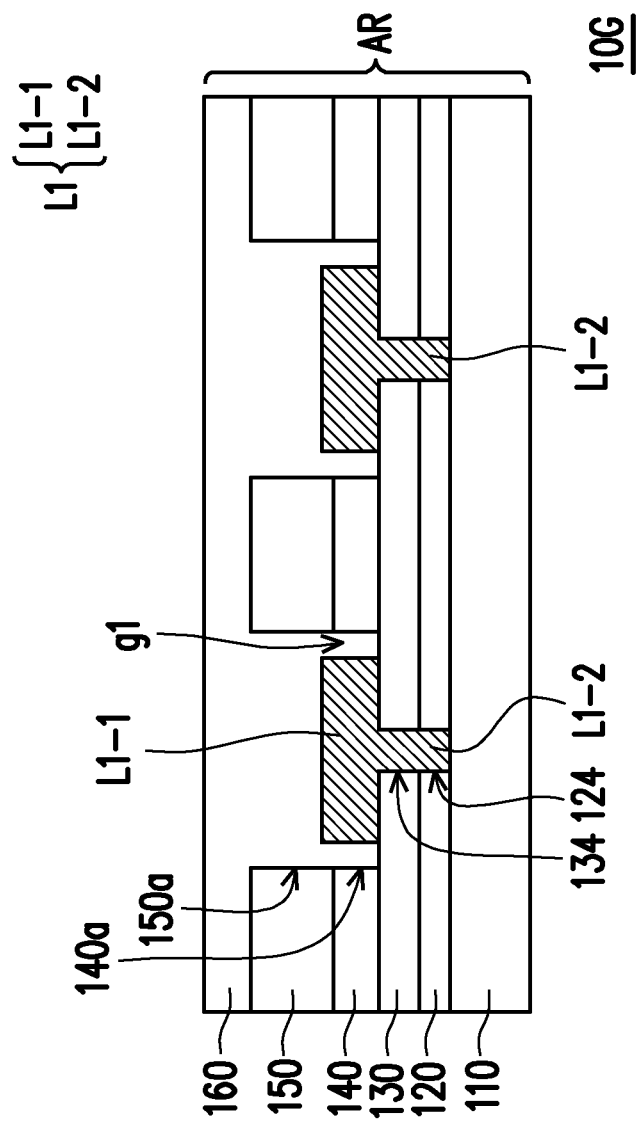
FIG. 12 is a schematic cross-sectional view of an electronic device 10G according to an embodiment of the disclosure.

FIG. 12 is a schematic cross-sectional view of an electronic device 10G according to an embodiment of the disclosure. The electronic device 10G of FIG. 12 is similar to the electronic device 10E of FIG. 10, and the difference between the two is that: in the embodiment of FIG. 12, the insulating layers 120 and 130 are disposed on the base 110 and have holes 124 and 134 smaller than the openings 150a and 140a, wherein the insulating layer 150 is disposed on the insulating layer 140, and the opening 150a of the insulating layer 150 and the opening 140a of the insulating layer 140 overlap the holes 124 and 134 of the insulating layers 120 and 130. A portion L1-1 of the first peripheral trace L1 is disposed on the insulating layer 130, and another portion L1-2 of the first peripheral trace L1 is filled in the holes 124 and 134 of the insulating layers 120 and 130.

Figure 13:
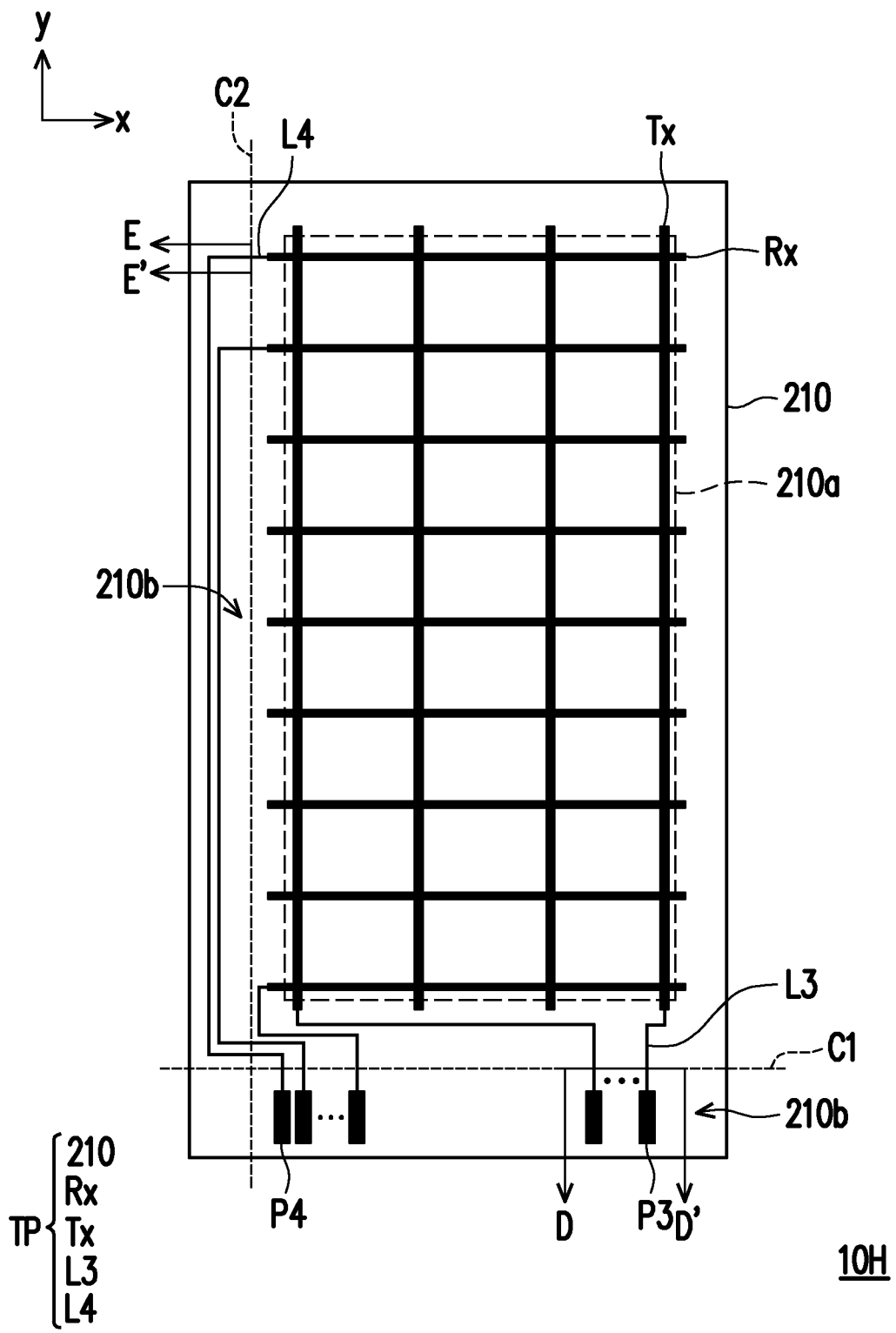
FIG. 13 is a schematic top view of an electronic device 10H according to an embodiment of the disclosure.

FIG. 13 is a schematic top view of an electronic device 10H according to an embodiment of the disclosure.

Figure 14:
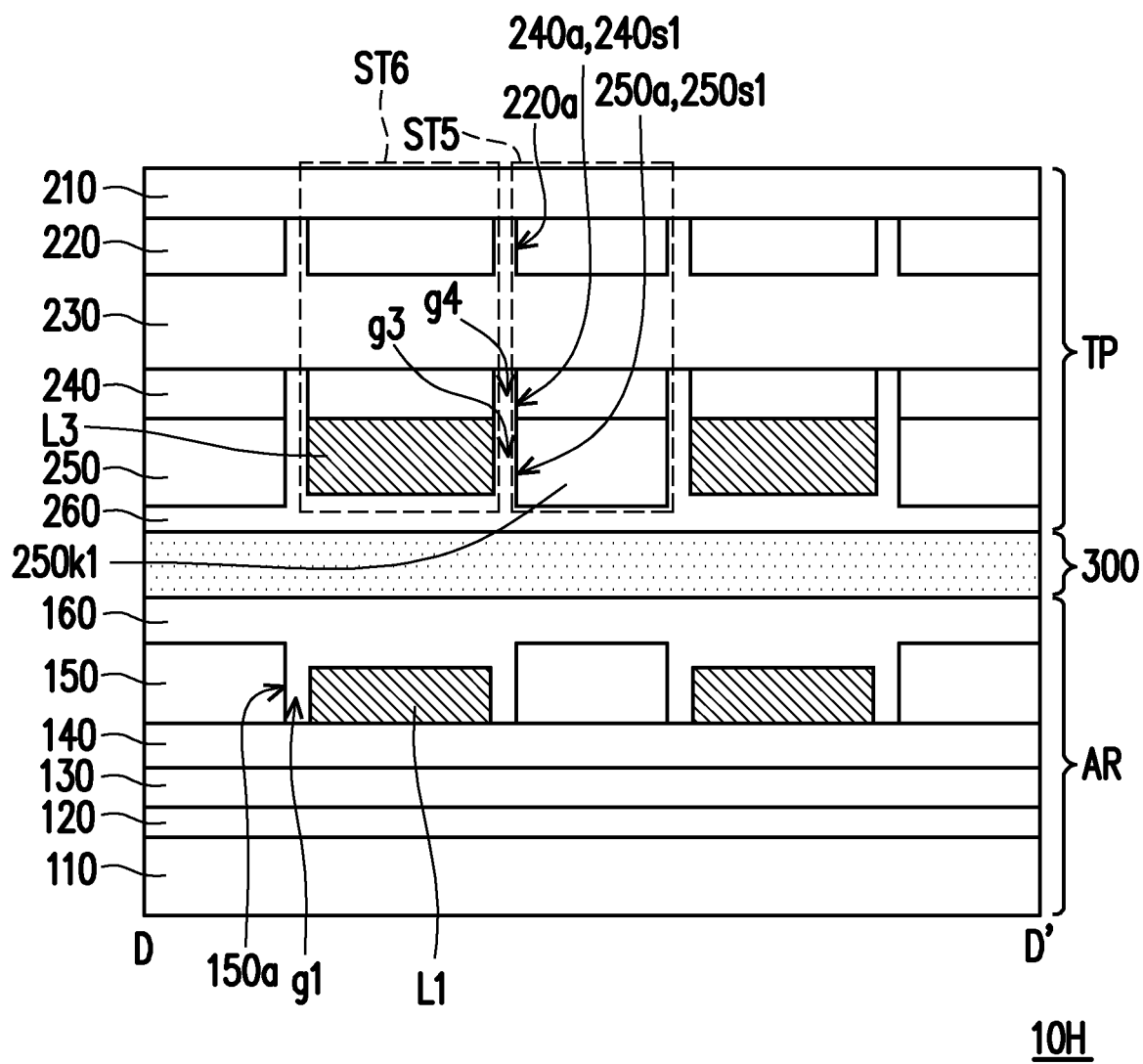
FIG. 14 is a schematic cross-sectional view of an electronic device 10H according to an embodiment of the disclosure.

FIG. 14 is a schematic cross-sectional view of an electronic device 10H according to an embodiment of the disclosure. FIG. 14 corresponds to the sectional line D-D' in FIG. 13.

Figure 15:
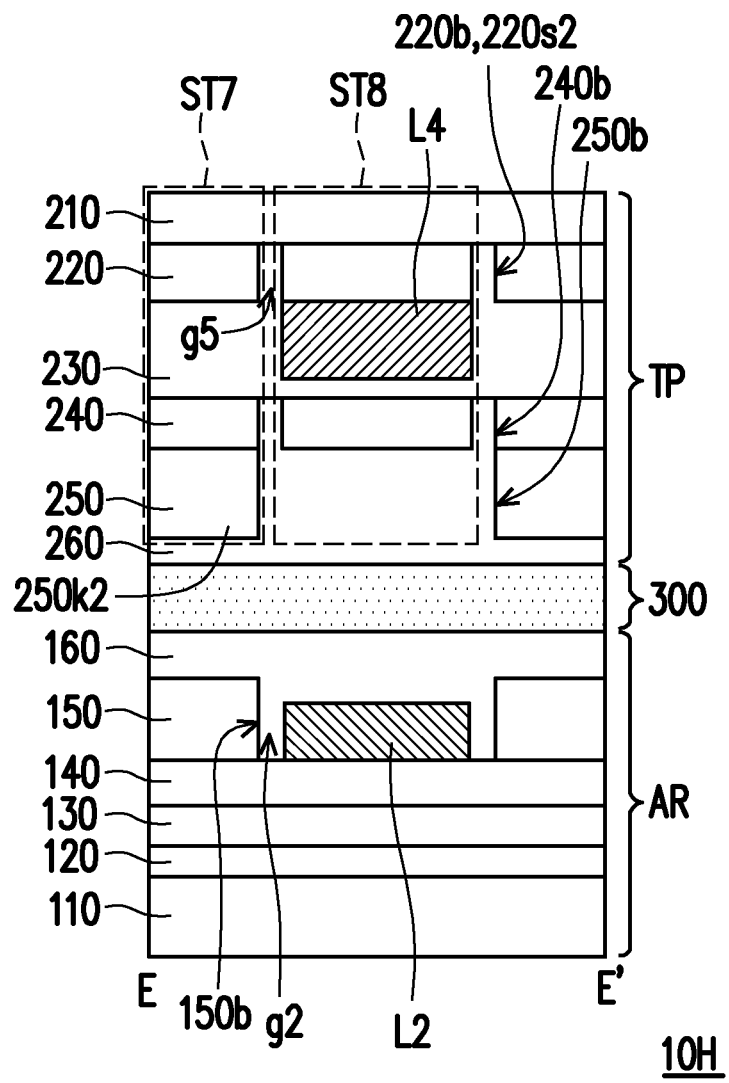
FIG. 15 is a schematic cross-sectional view of an electronic device 10H according to an embodiment of the disclosure.

FIG. 15 is a schematic cross-sectional view of an electronic device 10H according to an embodiment of the disclosure. FIG. 15 corresponds to the sectional line E-E' in FIG. 13.

FIG. 13 does not show the base 110, the insulating layer 120, the insulating layer 130, the insulating layer 140, the insulating layer 150, the insulating layer 160, the first peripheral trace L1, the second peripheral trace L2, the insulating layer 220, the insulating layer 230, the insulating layer 240, the insulating layer 250, the insulating layer 260, the filler 300 and other components in FIG. 14 and FIG. 15.

Referring to FIG. 13, FIG. 14 and FIG. 15, the electronic device 10H of this embodiment is similar to the electronic device 10 described above, and the difference between the two is that the electronic device 10H of this embodiment includes the second array substrate TP disposed the first array substrate AR, the second array substrate TP is disposed on the first array substrate AR and is connected to the first array substrate AR by using the filler 300.

The second array substrate TP includes a base 210. The base 210 has a working area 210a and a peripheral area 110b outside the working area 210a. In this embodiment, the base 210 of the second array substrate TP is a flexible base, but the disclosure is not limited thereto. For example, the material of the flexible base can be selected from organic polymers, such as: polyimide (PI), polyethylene naphthalate (PEN), polyethylene terephthalate (PET), polycarbonates (PC), polyether sulfone (PES) or polyarylate, other suitable materials, or a combination of at least two of the foregoing.

The second array substrate TP further includes a plurality of conductive structures. The conductive structure of the second array substrate TP includes a plurality of touch sensing electrodes Tx and Rx. That is to say, the second array substrate TP is a touch substrate, and the electronic device 10H of this embodiment is a touch and display device. For example, in this embodiment, the plurality of conductive structures of the second array substrate TP includes touch sensing electrodes Tx arranged in the first direction x and touch sensing electrodes Rx arranged in the second direction y, wherein the first direction x is alternated with the second direction y.

The second array substrate TP further includes a plurality of third peripheral traces L3 and a plurality of fourth peripheral traces L4. The plurality of third peripheral traces L3 are disposed on the peripheral area 210b of the base 210, and are respectively electrically connected to the plurality of touch sensing electrodes Tx. The plurality of fourth peripheral traces L4 are disposed on the peripheral area 210b of the base 210, and are respectively electrically connected to the plurality of touch sensing electrodes Rx.

In this embodiment, the plurality of third peripheral traces L3 are respectively electrically connected to the plurality of third testing pads P3, and the plurality of fourth peripheral traces L4 are respectively electrically connected to the plurality of fourth testing pads P4. In other words, in this embodiment, the third peripheral trace L3 may be a testing line electrically connected to the touch sensing electrode Tx, and the fourth peripheral trace L4 may be a testing line electrically connected to the touch sensing electrode Rx.

In this embodiment, the second array substrate TP further includes insulating layers 220, 230, 240, 250 and 260. The insulating layers 220, 240, and 250 are inorganic insulating layers, and the insulating layers 230 and 260 are organic insulating layers. Similarly, the melting point of the inorganic insulating layer of the second array substrate TP is higher than the melting point of the organic insulating layer of the second array substrate TP. For example, in this embodiment, the melting point of the inorganic insulating layer is about 1710° C. to 1900° C., and the melting point of the organic insulating layer is about 250° C., but the disclosure is not limited thereto. The material of the inorganic insulating layer of the second array substrate TP is, for example, silicon oxide, silicon nitride, silicon oxynitride, other suitable materials, or a stacked layer of at least two of the above materials, but the disclosure is not limited thereto. The material of the organic insulating layer of the second array substrate TP is, for example, a polymer material such as polyimide-based resin, epoxy-based resin, or acrylic-based resin, but the disclosure is not limited thereto.

Referring to FIG. 13 and FIG. 15, the insulating layer 220 is disposed on the base 210 and has an opening 220b, and the fourth peripheral trace L4 is disposed on the insulating layer 220 and located beside the opening 220b of the insulating layer 220. A gap g5 is formed between the fourth peripheral trace L4 and the sidewall 220s2 of the insulating layer 220 defining the opening 220b, and the insulating layer 230 is disposed on the fourth peripheral trace L4 and the insulating layer 220 and fills the gap g5.

It should be noted that FIG. 13 shows an electronic device 10H that has not been cut yet. The electronic device 10H of FIG. 13 is adapted to be cut along the predetermined cutting path C2. In this embodiment, the electronic device 10H is cut by using laser. The predetermined cutting path C2 is alternated with the plurality of fourth peripheral traces L4. When using laser to cut the electronic device 10H along the predetermined cutting path C2, a portion of each of the fourth peripheral traces L4 located at the predetermined cutting path C2 will be melted by laser. It should be noted that, because a portion of the fourth peripheral trace L4 that intersects the predetermined cutting path C2 is disposed next to the opening 220b of the insulating layer 220, and the gap g5 is formed between the sidewall 220s2 of the insulating layer 220 defining the opening 220b and the fourth peripheral trace L4, during the cutting process, the melted part of the fourth peripheral trace L4 will be restricted by the opening 220b of the insulating layer 220, and is less likely to be melted together with another adjacent fourth peripheral trace L4 to cause a short circuit.

In addition, in this embodiment, the insulating layer 240 is disposed on the insulating layer 230 and has an opening 240b overlapping the opening 220b of the insulating layer 220, and the insulating layer 250 is disposed on the insulating layer 240 and has an opening 250b overlapping the opening 240b and the fourth peripheral trace L4. The insulating layer 260 is disposed on the insulating layer 250 and fills the opening 250b of the insulating layer 250 and the opening 240b of the insulating layer 240.

The second array substrate TP includes a stacked structure ST7 and a stacked structure ST8 that are adjacent to each other and located at the predetermined cutting path C2, wherein the stacked structure ST8 has the fourth peripheral trace L4, a portion of the insulating layer 230 disposed in the gap g5, and a portion of the insulating layer 260 disposed in the opening 240b and the opening 250b. The stacked structure ST7 not only has the partial insulating layer 220, the partial insulating layer 230 and the partial insulating layer 240, but also has a solid portion 250k2 of the insulating layer 250. In this embodiment, the overall stacked structure ST8 has a low melting point and is relatively soft, and the overall stacked structure ST7 has a high melting point and is relatively hard. In this manner, when using laser to cut the electronic device 10H along the predetermined cutting path C2 (that is, when the stacked structure ST7 and stacked structure ST8 are melted by laser), a height difference is very likely to occur between the stacked structure ST7 and the stacked structure ST8, and the stacked structure ST7 will become a barrier to the stacked structure ST8. Accordingly, the fourth peripheral trace L4 in the stacked structure ST8 is less likely to be melted together with another adjacent fourth peripheral trace L4 to cause a short circuit, which contributes to further improvement in the manufacturing yield rate of the electronic device 10H.

Referring to FIG. 13 and FIG. 14, the insulating layer 250 further has an opening 250a, and the third peripheral trace L3 is disposed on the insulating layer 240 and located in the opening 250a of the insulating layer 250. There is a gap g3 formed between the sidewall 250s1 of the insulating layer 250 defining the opening 250a and the third peripheral trace L3. The insulating layer 260 is disposed on the insulating layer 250 and the third peripheral trace L3 and fills the gap g3.

FIG. 13 shows an electronic device 10H that has not been cut yet. The electronic device 10H of FIG. 13 is adapted to be cut along the predetermined cutting path C1. In this embodiment, the electronic device 10H is cut by using laser. The predetermined cutting path C1 is alternated with the plurality of third peripheral traces L3. When using laser to cut the electronic device 10H along the predetermined cutting path C1, a portion of each of the third peripheral traces L3 at the predetermined cutting path C1 will be melted by laser. It should be noted that, because a part of the third peripheral trace L3 intersecting the predetermined cutting path C1 is disposed in the opening 250a of the insulating layer 250, and the gap g3 is formed between the sidewall 250s1 of the insulating layer 250 defining the opening 250a and the third peripheral trace L3, during the cutting process, the melted part of the third peripheral trace L3 is restricted by the opening 250a of the insulating layer 250, and is less likely to be melted together with another adjacent third peripheral trace L3 to cause a short circuit.

In addition, in this embodiment, the insulating layer 240 is disposed on the insulating layer 230 and has an opening 240a overlapping the opening 250a of the insulating layer 250, a gap g4 is formed between the sidewall 240s1 of the insulating layer 240 defining the opening 240a and the third peripheral trace L3, and the insulating layer 260 fills the gap g4. The insulating layer 220 further has an opening 220a overlapping the opening 240a, and the insulating layer 230 fills the opening 220a.

The second array substrate TP includes a stacked structure ST5 and a stacked structure ST6 that are adjacent to each other and located at the predetermined cutting path C2, wherein the stacked structure ST6 has the third peripheral trace L3, a portion of the insulating layer 230 disposed in the opening 220a, and a portion of the insulating layer 260 disposed in the gap g3 and the gap g4. The stacked structure ST5 not only has the partial insulating layer 220, the partial insulating layer 230 and the partial insulating layer 240, but also has a solid portion 250k1 of the insulating layer 250. In this embodiment, the overall stacked structure ST6 has a low melting point and is relatively soft, and the overall stacked structure ST5 has a high melting point and is relatively hard. Please refer to FIG. 13 and FIG. 14, in this manner, when using laser to cut the electronic device 10H along the predetermined cutting path C1 (that is, when the stacked structure ST5 and stacked structure ST6 are melted by laser), a height difference is very likely to occur between the stacked structure ST5 and the stacked structure ST6, and the stacked structure ST5 will become a barrier to the stacked structure ST6. Accordingly, the third peripheral trace L3 in the stacked structure ST6 is less likely to be melted together with another adjacent third peripheral trace L3 to cause a short circuit, which contributes to further improvement in the manufacturing yield rate of the electronic device 10H.

What is claimed is:

1. An array substrate, comprising:
   a base having a working area and a peripheral area outside the working area;
   a plurality of conductive structures arranged in matrix on the working area of the base, wherein the plurality of conductive structures comprise a plurality of pixel structures;
   a peripheral trace disposed on the peripheral area of the base, and electrically connected to at least one of the plurality of conductive structures;
   a first insulating layer having an opening, wherein the peripheral trace is disposed in the opening or on the first insulating layer and beside the opening, and a gap is formed between a sidewall of the first insulating layer defining the opening and the peripheral trace;
   a second insulating layer disposed on the first insulating layer and the peripheral trace and fills the gap;
   a third insulating layer disposed on the base and having an opening, wherein the first insulating layer is disposed on the third insulating layer, and the opening of the first insulating layer overlaps the opening of the third insulating layer; and
   a fourth insulating layer disposed in the opening of the third insulating layer, wherein the peripheral trace is disposed on the fourth insulating layer.

2. The array substrate according to claim 1, wherein the peripheral trace has an edge in the opening of the first insulating layer, and the edge of the peripheral trace is substantially aligned with an edge of the base.

3. The array substrate according to claim 1, wherein a melting point of the first insulating layer is higher than a melting point of the peripheral trace.

4. The array substrate according to claim 1, wherein a melting point of the first insulating layer is higher than a melting point of the second insulating layer.

5. The array substrate according to claim 1, wherein a height of the sidewall of the first insulating layer is larger than a thickness of the peripheral trace.

6. The array substrate according to claim 1, wherein a melting point of the fourth insulating layer is lower than a melting point of the third insulating layer.

7. The array substrate according to claim 1, wherein a melting point of the fourth insulating layer is lower than a melting point of the first insulating layer.

8. The array substrate according to claim 1, wherein a portion of the peripheral trace is disposed on the third insulating layer, and another portion of the peripheral trace is filled into the hole of the third insulating layer.

9. The array substrate according to claim 1, wherein each of the pixel structures has a transistor and an electrode electrically connected to the transistor, the first insulating layer is provided on the transistor, the transistor has a control terminal, a first terminal and a second terminal, and the peripheral trace and the control terminal belong to the same layer.

10. The array substrate according to claim 1, wherein each of the pixel structures has a transistor and an electrode electrically connected to the transistor, the first insulating layer is disposed on the transistor, the transistor has a control terminal, a first terminal, and a second terminal, and the peripheral trace and the first terminal belong to the same layer.

11. The array substrate according to claim 1, further comprising:
a film disposed on the second insulating layer, wherein the film has a recess, and the recess of the film overlaps the opening of the first insulating layer.

12. The array substrate according to claim 1, further comprising:
a film disposed on the second insulating layer, wherein the film has a first portion and a second portion, the first portion of the film overlaps the opening of the first insulating layer, the second portion of the film overlaps a solid portion of the first insulating layer, and a thickness of the first portion of the film is smaller than a thickness of the second portion of the film.

13. The array substrate according to claim 1, further comprising:
a film; and
a light-shielding pattern layer disposed on the film and located between the film and the second insulating layer, wherein the light-shielding pattern layer has a recess, and the recess of the light-shielding pattern layer overlaps the opening of the first insulating layer.

14. The array substrate according to claim 1, further comprising:
a film; and
a light-shielding pattern layer disposed on the film and located between the film and the second insulating layer, wherein the light-shielding pattern layer has a first portion and a second portion, the first portion of the light-shielding pattern layer overlaps the opening of the first insulating layer, the second portion of the light-shielding pattern layer overlaps a solid portion of the first insulating layer, and a thickness of the first portion of the light-shielding pattern layer is smaller than a thickness of the second portion of the light-shielding pattern layer.

15. The array substrate according to claim 14, wherein the film has a first portion and a second portion, the first portion of the film overlaps the first portion of the light-shielding pattern layer, the second portion of the film overlaps the second portion of the light-shielding pattern layer, and a thickness of the first portion of the film is larger than a thickness of the second portion of the film.

\* \* \* \* \*